(12) United States Patent
Wang et al.

(10) Patent No.: US 11,662,438 B2
(45) Date of Patent: *May 30, 2023

(54) OPTICAL SCANNING APPARATUS AND LIDAR WITH EXTINCTION COMPONENT

(71) Applicant: SUTENG INNOVATION TECHNOLOGY CO., LTD., Shenzhen (CN)

(72) Inventors: Ji Wang, Shenzhen (CN); Bin Tan, Shenzhen (CN); Wei Wei, Shenzhen (CN)

( * ) Notice: Subject to any disclaimer, the term of this patent is extended or adjusted under 35 U.S.C. 154(b) by 25 days.

This patent is subject to a terminal disclaimer.

(21) Appl. No.: 17/371,050

(22) Filed: Jul. 8, 2021

(65) Prior Publication Data
US 2021/0341589 A1 Nov. 4, 2021

Related U.S. Application Data

(63) Continuation of application No. 17/002,682, filed on Aug. 25, 2020, now Pat. No. 11,085,997, and a
(Continued)

(30) Foreign Application Priority Data

Apr. 1, 2019 (CN) .......................... 201910255918.3

(51) Int. Cl.
*G01S 7/481* (2006.01)
*G02B 26/10* (2006.01)
*G01L 9/00* (2006.01)

(52) U.S. Cl.
CPC .......... *G01S 7/4817* (2013.01); *G02B 26/105* (2013.01); *B81B 2203/0127* (2013.01); *G01L 9/0041* (2013.01); *G01L 9/0048* (2013.01)

(58) Field of Classification Search
None
See application file for complete search history.

(56) References Cited

U.S. PATENT DOCUMENTS 5,991,016 A 11/1999 Irie
10,351,616 B2 * 7/2019 Yun ...................... G01N 21/636
(Continued)

FOREIGN PATENT DOCUMENTS

CN 2689219 Y 3/2005
CN 102221525 A 10/2011
(Continued)

OTHER PUBLICATIONS

International Search Report issued in corresponding International Application No. PCT/CN2020/082485, dated Jun. 30, 2020, 5 pages.
(Continued)

*Primary Examiner* — Peter J Macchiarolo
*Assistant Examiner* — Jermaine L Jenkins
(74) *Attorney, Agent, or Firm* — Bayes PLLC

(57) ABSTRACT

An apparatus in the field of optics technology, can include a reflector, a reflector substrate, and an extinction component. The reflector can be mounted on the reflector substrate. The extinction component can be arranged on a front surface of the reflector substrate. The reflector can be configured to reflect incident light signals. The extinction component can be configured to reduce the scattered light produced by the incident light signal on the reflector substrate. An optical scanning device (for example, lidar) having such features may greatly reduce the scattered light inside the lidar, reduce the detection blind area caused by the stray light, and greatly improve the receiving and detecting capabilities of the lidar.

20 Claims, 9 Drawing Sheets

Related U.S. Application Data continuation of application No. PCT/CN2020/082485, filed on Mar. 31, 2020.

(56) References Cited

U.S. PATENT DOCUMENTS

| | | | |
|---|---|---|---|
| 10,732,102 B2* | 8/2020 | Ohno | G01N 21/455 |
| 11,085,997 B2* | 8/2021 | Wang | G02B 26/105 |
| 2003/0146282 A1* | 8/2003 | Tsikos | B82Y 15/00 |
| | | | 235/454 |
| 2008/0259427 A1* | 10/2008 | Voss | G02B 26/105 |
| | | | 359/206.1 |
| 2008/0316562 A1 | 12/2008 | Sanders et al. | |
| 2011/0235018 A1 | 9/2011 | Mori et al. | |
| 2019/0178990 A1* | 6/2019 | Bogatscher | G01S 17/42 |
| 2019/0339356 A1* | 11/2019 | Schildknecht | G01S 7/4808 |
| 2020/0142034 A1* | 5/2020 | Shepard | G01S 17/42 |

FOREIGN PATENT DOCUMENTS

| | | |
|---|---|---|
| CN | 104330843 A | 2/2015 |
| CN | 106644074 A | 5/2017 |
| CN | 107209267 A | 9/2017 |
| CN | 110045498 A | 7/2019 |
| CN | 210038328 U | 2/2020 |
| DE | 102017209645 A1 | 12/2018 |
| WO | 2016097409 A2 | 6/2016 |

OTHER PUBLICATIONS

First Office Action issued in related Chinese Application No. 202080004329.9, dated Jan. 24, 2022, 6 pages.
Second Office Action issued in related Chinese Application No. 202080004329.9, dated Aug. 11, 2022, 5 pages.
Extended European Search Report issued in related European Application No. 20783194.2, dated May 2, 2022, 8 pages.

* cited by examiner

OPTICAL SCANNING APPARATUS AND LIDAR WITH EXTINCTION COMPONENT

CROSS-REFERENCE TO RELATED APPLICATION

This application is a continuation of U.S. patent application Ser. No. 17/002,682, filed Aug. 25, 2020, which was a bypass continuation of International Application No. PCT/CN2020/082485, filed Mar. 31, 2020, and also claims the priority of Chinese patent application number CN 201910255918.3, filed Apr. 1, 2019, the entirety of each of which is hereby incorporated herein by reference.

TECHNICAL FIELD

Embodiments of the present disclosure relate to the field of optics technology, and in particular to an optical scanning apparatus and a lidar device.

BACKGROUND

With the development of lidar technology, people have increasingly higher requirements on lidar detection performance. Solid-state lidar has aroused wide concern because of its advantages such as high system reliability, excellent detection performance, and easy control of cost.

The inventor has found that in solid-state lidars, microelectromechanical systems (MEMS) are typically used for the core devices of scanning components. However, because MEMS themselves have reflection and scattering characteristics to the laser light signals, disordered stray light signals will occur inside the lidar. Because the receiving module of the lidar is extremely sensitive and tends to respond to these stray light signals, light signals reflected from the proximity of the lidar in the field of view submerge in the stray light signals. As such, the receiving module cannot distinguish the light signals reflected from the proximity of the lidar, and cannot effectively identify nearby objects, resulting in a larger detection blind area.

SUMMARY

In view of the above problems, the embodiments of the present disclosure provide an optical scanning apparatus and a lidar, which overcome the above problems or at least partially solve the above problems.

According to an aspect of an embodiment of the present disclosure, there is provided an optical scanning apparatus, the apparatus includes a reflector, a reflector substrate and an extinction component; the reflector is mounted on the reflector substrate, and the extinction component is arranged on the front of the reflector substrate.

The reflector is used to reflect incident light signals.

The extinction component is used to reduce the scattered light signals produced by the incident light signals on the reflector substrate.

According to another aspect of the embodiment of the present disclosure, there is provided an optical scanning apparatus. The apparatus includes a reflector, a connection frame, a reflector substrate and an extinction layer. The reflector and the reflector substrate are connected by the connection frame. The connection frame is provided with a coil. The front surface of the reflector substrate and the connection frame are provided with the extinction layer for reducing the stray light signals produced by the incident light signals on the connection frame and the reflector substrate.

According to another aspect of the embodiment of the present disclosure, there is provided a lidar, including the foregoing optical scanning apparatus.

For the optical scanning apparatus and the lidar described in the embodiments of the present disclosure, the optical scanning apparatus includes a reflector, a reflector substrate and an extinction component, wherein the reflector is mounted on the reflector substrate, and the reflector is used to reflect the incident light signals. In addition, the extinction component is arranged in front of the reflector substrate and the extinction component can reduce the incident light signals falling on the reflector substrate, thereby reducing the scattered light signals produced by the incident light signals on the reflector substrate. At the same time, the scattering coefficient on the surface of the extinction component is smaller than that of the front surface of the reflector substrate, thereby greatly reducing the scattered light signals inside the lidar and reducing the detection blind area caused by stray light signals, and thus greatly improving the receiving and detecting ability of the lidar.

The above description is only an overview of the technical solutions of the present disclosure. Specific implementations of this disclosure are provided below for the purpose of understanding the technical means of this disclosure more clearly and enabling implementation of the present disclosure according to the content of the specification, and making the abovementioned and other purposes, features and advantages of this disclosure more apparent.

BRIEF DESCRIPTION OF THE DRAWINGS

By reading the detailed description of the disclosed implementations below, various other advantages and benefits will become clear to those of ordinary skill in the art. The drawings are only used to show the disclosed implementations, and are not considered as limitations to the present disclosure. And throughout the drawings, the same reference symbol indicates the same component. In the drawings.

The reference numbers in the specific implementation are as follows:

10. Lidar; 11. Transceiver component; 12. Turn back mirror; 13. Optical scanning apparatus; 14. Base; 100. Reflector; 200. Reflector substrate; 300. Extinction component; 400. Extinction layer; 110. Reflector; 120. Connection frame; 121. Coil; 130. Reflector substrate;

140. Outer connection bridge; 150. Inner connection bridge; 160. Diaphragm; 161. Light shielding plate; 162. Light pass aperture; 163. Transitional interface; 164. First slope; 165. Second slope; 166. Intersection line.

DETAILED DESCRIPTION

Embodiments of the technical solutions of the present disclosure will be described in detail below with reference to the drawings. The following embodiments are only used to more clearly explain the technical solutions of the present disclosure, and therefore are only used as examples, and shall not be used to limit the protection scope of the present disclosure.

Figure 1:
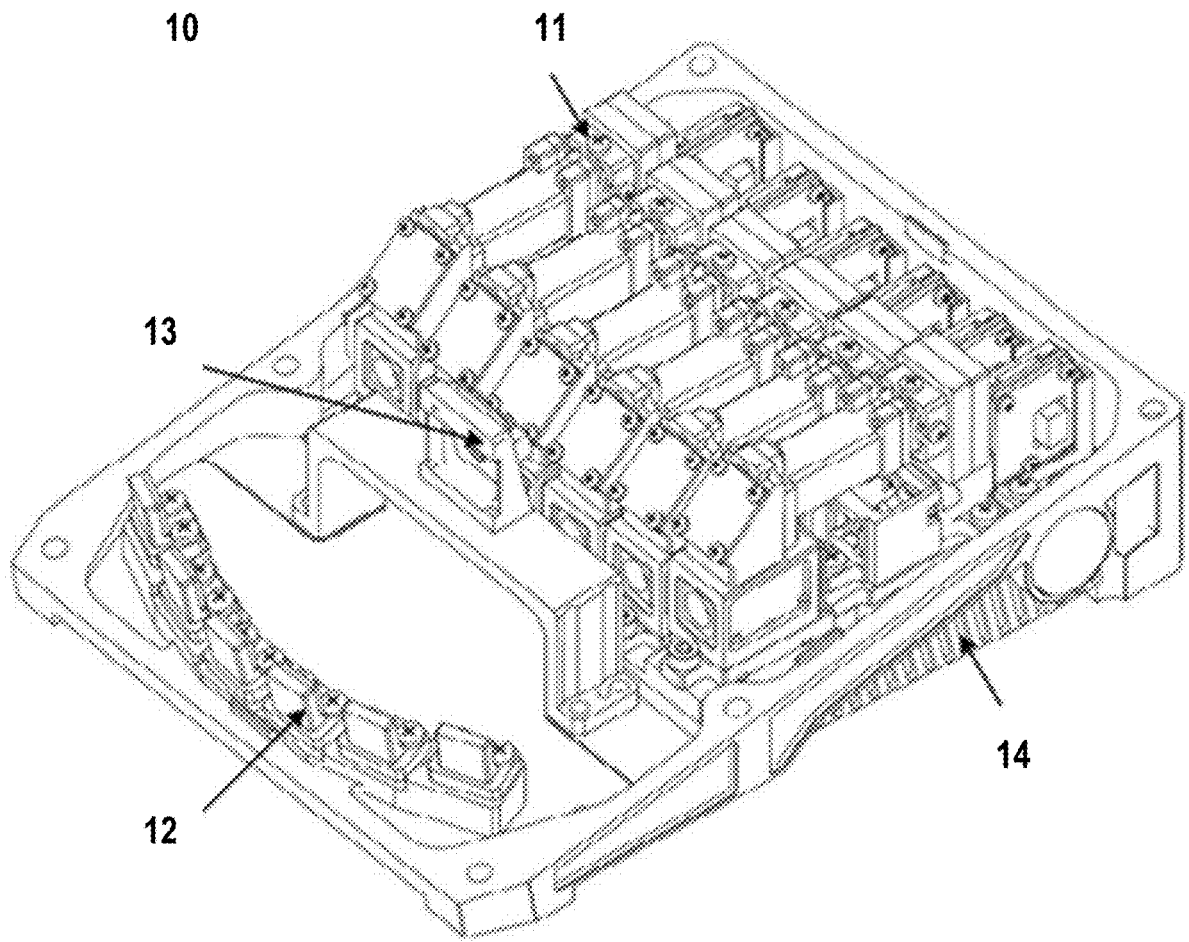
FIG. 1 shows a structural diagram of a lidar.

Referring to FIG. 1, which shows a lidar 10 including at least one transceiver component 11, at least one turn back mirror 12, an optical scanning apparatus 13 and a control component (not shown in the figures). The transceiver component 11 and the turn back mirror 12 are arranged in one-to-one correspondence.

Take a transceiver component 11 and a corresponding turn back mirror 12 for example. The transceiver component 11 transmits transmitted light signals to the turn back mirror 12, and the turn back mirror 12 reflects the transmitted light signals to the optical scanning apparatus 13, and the optical scanning apparatus 13 receives the transmitted light signals reflected by the turn back mirror 12 and then transmits them outwards for scanning. Objects in the detection area reflect the outward transmitted light signals, and return the reflected light signals. Part of the reflected light signals having the same light path and the opposite direction as the transmitted light signals are coaxially transmitted to the optical scanning apparatus 13. The optical scanning apparatus 13 deflects the received reflected light signals and then transmits them to the turn back mirror 12, and the turn back mirror 12 reflects the reflected light signals to the transceiver component 11. The light paths of the transmitted light signals and the corresponding reflected light signals pass through a group of transceiver component 11 and turn back mirror 12 arranged correspondingly, and are scanned and received by the optical scanning apparatus 13 to form a field of view. The control component is configured to drive and control the transceiver component 11 and the optical scanning apparatus 13.

The lidar 10 may include one group of transceiver component 11 and turn back mirror 12, and may include a plurality of groups of transceiver component 11 and turn back mirror 12 arranged in correspondence. A plurality of groups of the transceiver components 11 and the turn back mirror 12 are arranged in sequence, and their light paths are at different angles with the optical scanning apparatus 13, i.e., a plurality of transmitted light signals are transmitted to the optical scanning apparatus 13 at different angles, reflected by the optical scanning apparatus 13 and then transmitted outwards and scan different spatial regions, and the plurality of reflected light signals are coaxially returned and received by the corresponding transceiver components 11. Multiple fields of view that do not completely overlap in space are formed. And after being scanned and received by the optical scanning apparatus 13, multiple fields of view are formed, thereby expanding the overall field of view of the lidar 10. As shown in FIG. 1, the lidar 10 further includes a housing assembly, including a top cover (not shown in the figure) and a base 14. The base 14 is provided with six groups of transceiver components 11 and turn back mirrors 12 arranged correspondingly. The six transceiver components 11 are sequentially arranged and fixed on the base 14, and the front end of each transceiver component 11 is correspondingly provided with a turn back mirror 12, there is a total of six turn back mirrors. The optical scanning apparatus 13 is fixed to the base 14 by a mounting bracket. It can be seen from the foregoing that the lidar 10 can form six fields of view arranged in sequence in the horizontal direction. After splicing, the horizontal field of view of the lidar is greatly expanded, for example, the horizontal field of view can reach 120°, which improves the detecting ability of the lidar.

Each transceiver component 11 includes a transmitting module, a beam splitting module and a receiving module. The transmitted light signals transmitted by the transmitting module pass through the beam splitting module and then are transmitted outwards, the coaxially reflected light signals enter the transceiver component 11 and are deflected by the beam splitting module and then received by the receiving module. The foregoing control component is used to drive the transmitting module and the receiving module, and is also used to perform signal processing and transmission on the reflected light signals received by the receiving module.

Figure 4:
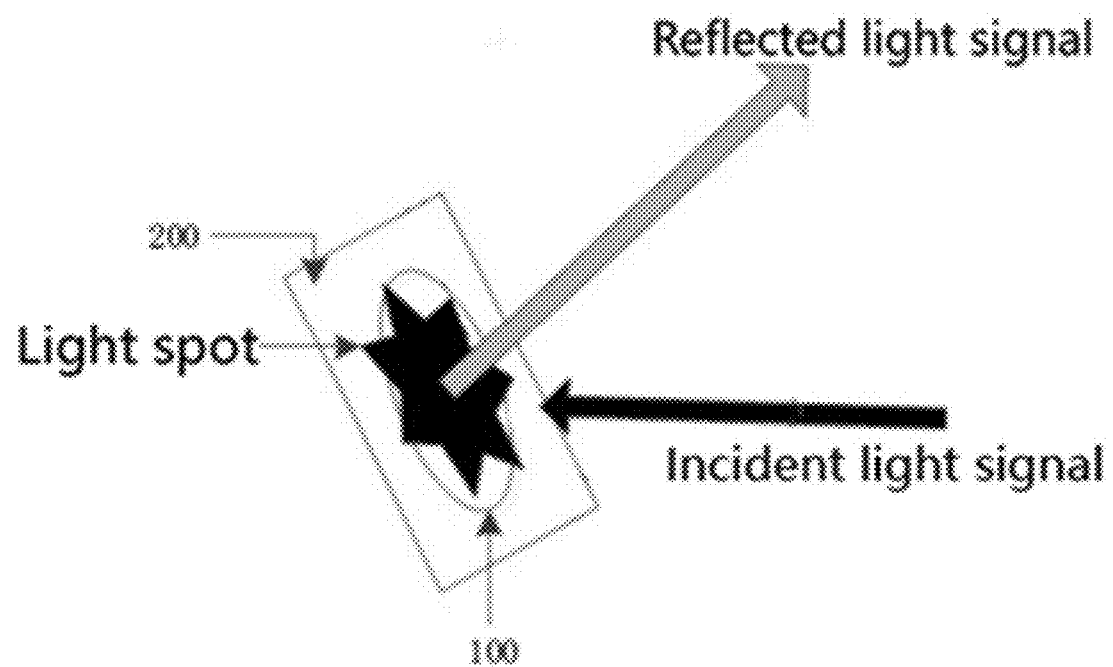
FIG. 4 shows a schematic diagram of a reflector and a light spot of an incident light signal of an embodiment of an optical scanning apparatus of the present disclosure.

The above-mentioned optical scanning apparatus 13 may be micro-electro mechanical systems (MEMS for short) or other galvanometer systems. Referring to FIG. 4, since the reflector 100 of the optical scanning apparatus is very small in volume, the light spots of the transmitted light signals and the reflected light signals falling on the optical scanning apparatus tend to be larger than the working surface of the optical scanning apparatus. That is to say, the mirror surface of the reflector 100 of the optical scanning apparatus, especially the light spot of the reflected light signal is larger. Part of the light signals with light spots exceeding the reflector 100 falls on the reflector substrate 200, the reflector substrate 200 reflects or scatters the light signals, and the scattered light signal is different from its original light path direction to become a stray light signal. The stray light signal is received by the transceiver component 11, which causes the receiving module of the transceiver component 11 to respond to the stray light signal, and thus makes the receiving module premature saturated and unable to quickly respond to the light signal returned from the proximity of the lidar in the field of view. The receiving module cannot distinguish the light signal reflected from the proximity of the lidar in the field of view, and cannot effectively identify the near object, resulting in a larger detection blind area.

Figure 2:
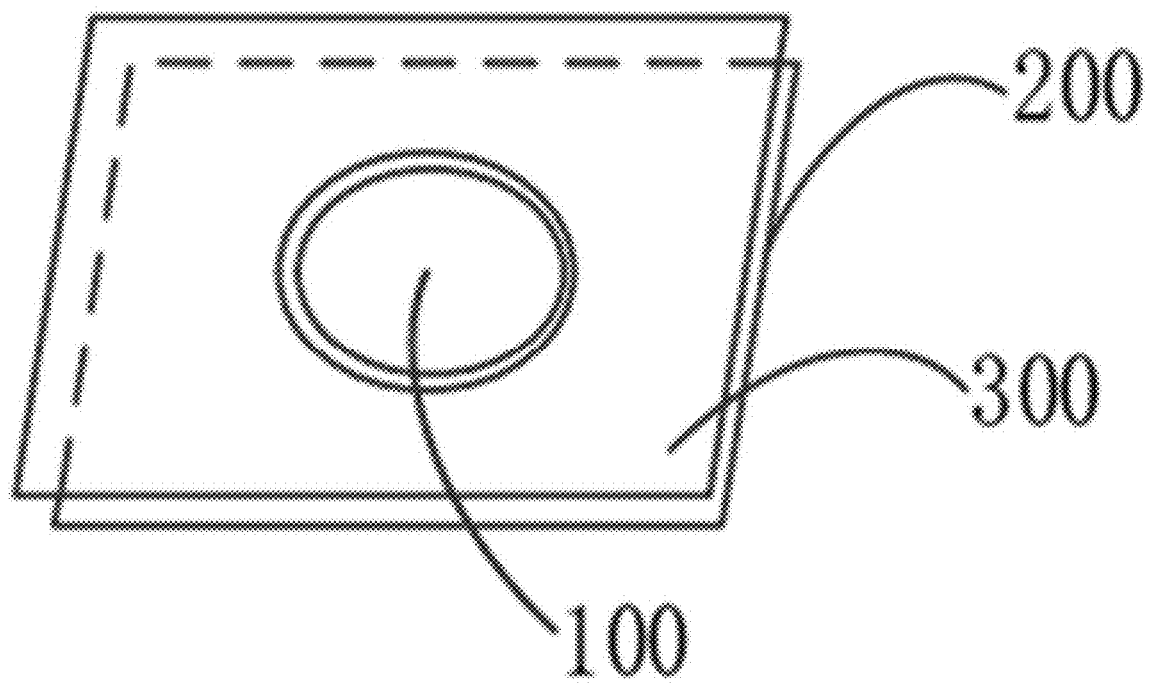
FIG. 2 shows a structural diagram of an embodiment of an optical scanning apparatus of the present disclosure.

In view of the above technical problems, FIG. 2 shows a structural schematic diagram of an optical scanning apparatus provided by an embodiment. The optical scanning apparatus includes a reflector 100, a reflector substrate 200 and an extinction component 300. The reflector 100 is mounted on the reflector substrate 200; the extinction component 300 is arranged in front of the reflector substrate 200. The reflector 100 is used to reflect the incident light (i.e. incident light signal). The extinction component 300 is used to reduce the scattered light produced by the incident light (i.e. incident light signal) on the reflector substrate 200.

Figure 3:
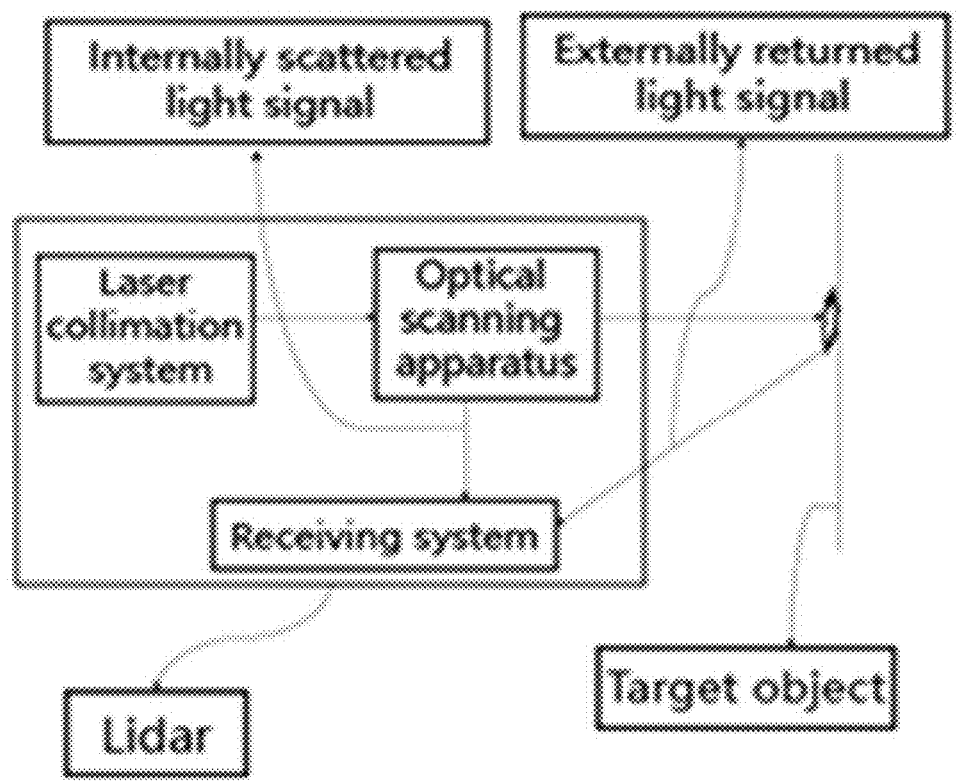
FIG. 3 shows a path of a major light signal generated in a lidar of an embodiment of the present disclosure.

Note that, FIG. 3 shows a path of a major light signal generated in a lidar. Wherein, the laser collimation system (i.e., transmitting module) is a laser transmitting system with a smaller beam divergence angle. It consists of a laser light source and a collimation optical system. Optionally, the laser light source may include, but not be limited to, solid-state laser light sources, gas laser light sources, semiconductor laser light sources, liquid laser light sources, chemical laser light sources, fiber laser light sources and free-electron laser light source lamps. Optionally, collimated optical systems may include, but are not limited to, spherical lens optical system combinations, cylindrical lens optical system combinations, aspherical lens optical system combinations, foldback type hybrid optical system combinations, and gradient index(GRIN) composite optical system combinations, etc. Usually, the laser collimation system (i.e., transmitting module) of the lidar transmits the transmitted light signal, and the transmitted light signal reaches the target object through the optical scanning apparatus. This part of the transmitted light signal is reflected by the target object and returned to the receiving system (i.e., receiving module) of the lidar. In addition, some light signals cause scattering inside the optical scanning apparatus. The incident light (i.e., incident light signal) can be either one or more of the transmitted light signal transmitted to the optical scanning apparatus and the reflected light signal received by the optical scanning apparatus. As mentioned above, when the incident light signals (transmitted light signals or reflected light signals) enter the optical scanning apparatus, most of the incident light signals are concentrated on the reflector 200 and reflected to the target object, but the part of the incident light signals with light spots exceeding the reflector 100 is scattered by the reflector substrate 200 and exhibits like an Nth cosine scattering characteristic distribution. The scattered light is captured by the receiving system (i.e., the receiving module), causing the receiving system (i.e., the receiving module) to form a signal response of the internal scattering (i.e., stray light signals), so that the receiving system (i.e., the receiving module) is premature saturated, unable to respond to returned light signals (i.e., the reflected light signals) from the proximity of the lidar, so that the returned light signals (i.e., the reflected light signals) are submerged in the signals produced by the internal stray lights (i.e., stray light signals), resulting in a detection blind area.

Specifically, the above optical scanning apparatus includes a reflector 100, a reflector substrate 200 and an extinction component 300. Wherein, the reflector 100 is mounted on the reflector substrate 200; the extinction component 300 is arranged in front of the reflector substrate 200. Optionally, the extinction component 300 may be attached to the front surface of the reflector substrate 200, or may be arranged at a certain distance in front of the reflector substrate 200, which is not limited in this embodiment. When the light signals (transmitted light signals or reflected light signals) enter the optical scanning apparatus, since the extinction component 300 is arranged in front of the reflector 200, most of the incident light signals (i.e., transmitted light signals or reflected light signals) enter the reflector 100 and are then reflected, a small part of the incident light signals first passes through the extinction component 300, which can reduce or even approximately eliminate part of the incident light signals that don't fall on the reflector 100, thereby greatly reducing the incident light signals that would fall on the reflector substrate 200, thus greatly reducing the scattered light reflected by the reflector substrate 200 from the incident light signal.

In this embodiment, the optical scanning apparatus includes a reflector, a reflector substrate and an extinction component, wherein the reflector is mounted on the reflector substrate, and the reflector is used to reflect the incident light signals. In addition, the extinction component is arranged in front of the reflector substrate and the extinction component can reduce the incident light signals falling on the reflector substrate, thereby reducing the scattered lights produced by the incident light signals on the reflector substrate. At the same time, the scattering coefficient of the surface of the extinction component is smaller than that of the front surface of the reflector substrate, thereby greatly reducing the scattered lights (i.e., stray light signal) inside the lidar and reducing the detection blind area caused by stray light signals, and thus greatly improving the receiving and detecting ability of the lidar.

Optionally, with continued reference to FIG. 2, on the basis of the above embodiment, the extinction component 300 can be a diaphragm, and the diaphragm is arranged on the front of the reflector 100, and the light pass aperture of the diaphragm is aligned with the reflector 100.

Specifically, since the diaphragm is arranged on the front of the reflector 100, i.e. on the incident side, before the incident light signal enters the reflector 100, the incident light signal is first selected by the diaphragm. Since the light pass aperture of the diaphragm is aligned with the reflector 100, the part of the incident light signals falling into the light pass aperture of the diaphragm can reach the reflector 100, and the rest part of the incident light signals falling on the diaphragm can be prevented from falling on the reflector substrate 200 by the function of the diaphragm.

In this embodiment, through disposing the diaphragm on the front of the reflector and aligning the light pass aperture of the diaphragm with the reflector, the light signals falling on the reflector substrate are greatly reduced, thereby reducing the scattered light produced by the incident light signal on the reflector substrate, so that the scattered light (i.e., stray light signal) inside the optical scanning apparatus is greatly reduced, which greatly reduces the detection blind area caused by the stray light signal and greatly improves the receiving and detecting abilities of the lidar.

Optionally, the surface scattering coefficient of the above-mentioned diaphragm is smaller than the scattering coefficient of the front surface of the reflector substrate 200. By setting the surface scattering coefficient of the diaphragm to be smaller than the scattering coefficient of the front surface of the reflector substrate 200, compared with the degree of scattering of the incident light signal by the reflector substrate 200, it can greatly reduce the scattering of the incident light signal falling on the diaphragm, and then greatly reduce the scattered light, so that the scattered light inside the lidar (i.e., stray light signal) is greatly reduced, and the detection blind area caused by the stray light signal is reduced, which greatly improves the receiving and detecting abilities of the lidar.

Optionally, a light absorbing film or a light reflecting film may be attached to the diaphragm to reduce the scattering coefficient of the surface of the diaphragm. Generally, an object has three responses of incident, reflected and scattered to a light signal. Due to conservation of energy, the scattering characteristics can be reduced by increasing absorption and reflection. Therefore, by attaching a light absorbing film to the surface of the diaphragm, more incident light signals can be absorbed, thereby greatly reducing scattered light; or by attaching a light reflecting film to the surface of the diaphragm, more light signals can be reflected. Since the reflection can be directional, the light signal can be reflected to a direction that does not affect the receiving system, thereby greatly reducing scattered light. In this embodiment, the light absorbing film is attached to the diaphragm to increase the absorption of the incident light signal to reduce scattering, or the light reflecting film is attached to the diaphragm to enhance the reflection of the incident light signal to reduce scattering, thereby reducing the scattering coefficient on the surface of the diaphragm and reducing the detection blind area caused by stray light, which greatly improves the receiving and detecting abilities of the lidar.

Optionally, the thickness of the above diaphragm is less than the preset thickness threshold, which is determined by that the diaphragm does not block the incident light signal reflected by the reflector.

Specifically, the thickness of the above diaphragm needs to be less than the preset thickness threshold. If the thickness of the diaphragm is too thick, it will interfere with the incident light signal and affect the receiving performance of the receiving system. Therefore, the thickness of the diaphragm can be less than the thickness threshold by setting the thickness threshold, thus ensuring that the diaphragm will not block the incident light signal reflected by the reflector due to the excessive thickness. Specifically, the thickness of the above diaphragm should be as small as possible to minimize the impact on the incident light signal.

Optionally, on the basis of the above embodiments, the area of the light pass aperture of the diaphragm is greater than or equal to the area of the reflector 100.

Specifically, the area of the light pass aperture of the diaphragm can be greater than or equal to the area of the reflector 100, the area of the light pass aperture can be slightly greater than the area of the reflector 100, and can also equal to the area of the reflector 100. Through setting the area of the light pass aperture of the diaphragm greater than or equal to the area of the reflector, it is ensured that the incident light signal can fall on the reflector as much as possible, while at the same time reducing the scattering of the incident light signal by the reflector substrate as much as possible, thereby ensuring the response of the optical scanning apparatus to the light signal and reducing the detection blind area caused by the stray light, so that the receiving and detecting ability of the lidar is greatly improved.

Optionally, on the basis of the above embodiments, the diaphragm is provided at the front of the reflector 100 in accordance with a predetermined setting height; the setting height is determined according to the maximum incident angle of the incident light signal and the radius difference between the diaphragm and the reflector.

Figure 5:
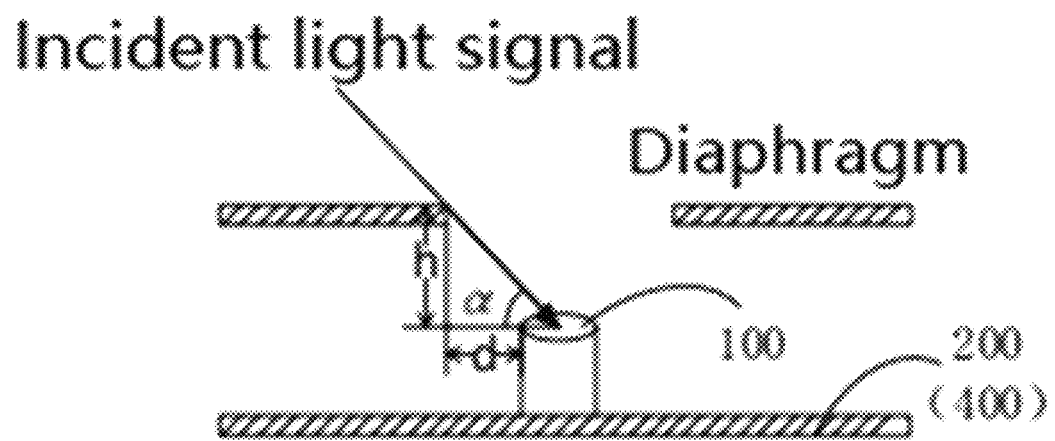
FIG. 5 shows a schematic diagram for determining a predetermined height set by a diaphragm of an optical scanning apparatus of the present disclosure.

Specifically, when the incident light signals is transmitted toward the reflector 100, there will be an angle with the plane of the reflector and the incident light signals, and when the angle is too large, it may not be able to enter the reflector 100 and falls on the reflector substrate 200. In order to ensure that the incident light signal transmitted toward the reflector is blocked by the diaphragm as little as possible, the setting height of the diaphragm can be determined according to the maximum incident angle of the incident light signal, the radius difference between the diaphragm and the reflector 100. It can be seen in FIG. 5, d is the difference between the radius of the diaphragm and the radius of the reflector 100, a is the maximum incidence angle of the incident light signal, and h is the setting height of the diaphragm, wherein the height value is the distance between the front surface of the diaphragm and the reflector 100. Optionally, the setting height of the diaphragm can be determined by the formula or a variation of the formula.

In this embodiment, the diaphragm is arranged on the front of the reflector according to the predetermined setting height, since the setting height is determined by the maximum incidence angle of the incident light signal and the radius difference between the diaphragm and the reflector, it can ensure that the incident light signal passes through the light pass aperture of the diaphragm as much as possible and is transmitted towards the reflector, so that the incident light signal can be reflected to the greatest extent, thereby improving the light utilization rate and the detecting ability of the lidar.

Optionally, on the basis of the foregoing embodiments, an extinction layer 400 may be attached to the front surface of the reflector substrate 200, and the extinction layer 400 is used to reduce the scattering of the incident light signal by the reflector substrate 200. Specifically, since the diaphragm is unable to eliminate the incident light signal irradiated on the reflector substrate 200 completely, the extinction layer 400 can also be attached on the front surface of the reflector substrate 200. The extinction layer can further reduce the scattering of the incident light signal by the reflector substrate 200. Optionally, the extinction layer 400 may be a light reflecting layer or a light absorbing layer. When the extinction layer 400 is a light reflecting layer, it can reduce the scattering characteristics by increasing the reflection characteristics to the incident light signal; when the extinction layer 400 is a light absorbing layer, it can reduce the scattering characteristics by increasing the absorption characteristics to the incident light signal. Therefore, the scattering of the reflector substrate to the incident light signal can be further reduced, and the detection blind area caused by stray light can be reduced, so that the receiving detecting ability of the lidar is greatly improved.

Figure 6:
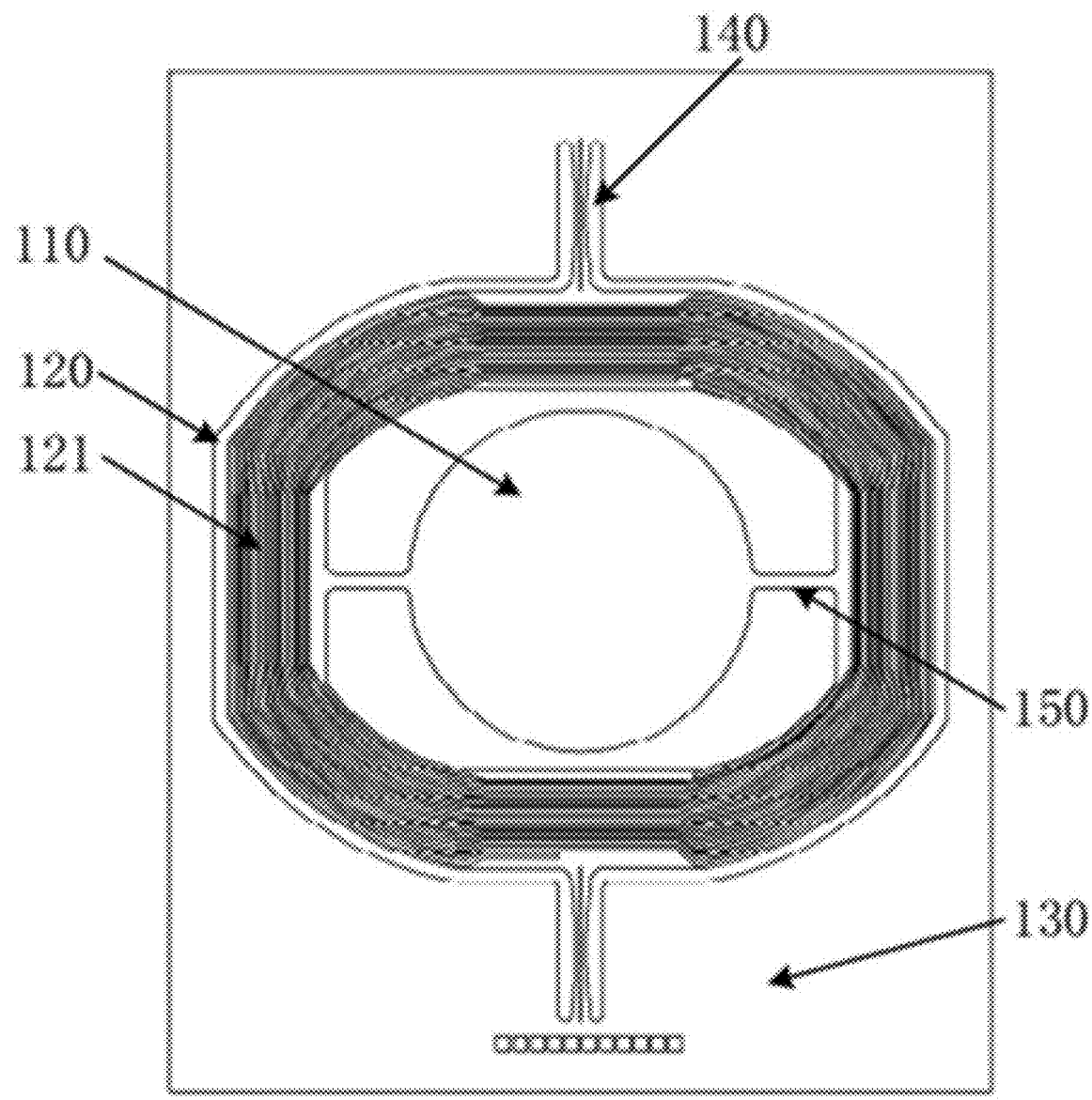
FIG. 6 shows a structural diagram of another embodiment of an optical scanning apparatus of the present disclosure.

Referring to FIG. 6, FIG. 6 shows a structural diagram of an optical scanning apparatus provided by another embodiment. The optical scanning apparatus includes a reflector 110, a connection frame 120 and a reflector substrate 130. The reflector substrate 130 is stationary relative to a mounting bracket, the reflector 110 vibrates relative to the reflector substrate 130 to realize scanning. The connection frame 120 connects the reflector 110 and the reflector substrate 130. An outer connection bridge 140 connects the reflector substrate 130 and the connection frame 120. An inner connection bridge 150 connects the connection frame 120 and the reflector 110. The number of the outer connection bridge 140 can be two and the two outer connection bridges 140 are on the second axis. The number of the inner connection bridge 150 can also be two, and the two inner connection bridges 150 are on the first axis. The reflector 110 vibrates relative to the first axis and the second axis. The connection frame 120 is provided with a coil 121, the coil 121 is applied with electromagnetic force to vibrate, thereby driving the reflector 110 to vibrate. It should be noted that the coil 121 may be provided on the back surface of the connection frame 120 or on the front surface of the connection frame 120. Since the area of the reflector substrate 130 is smaller, the circuits on the back surface of the reflector substrate 130 are arranged densely. In order to save space on the back surface of the reflector substrate 130, the coil 121 can be arranged on the front surface of the connection frame 120, as long as the coil 121 does not block the light signal through in and out of the reflector 110.

Optionally, both of the front surface of the reflector substrate 130 and the front surface of the connection frame 120 are provided with an extinction layer. The extinction layer is used to reduce the scattering of the incident light signals by the reflector substrate 130 and the connection frame 120. The front surface of the reflector substrate 130 is a metallic reflection plane, and most of the incident light signals (such as the transmitted light signal and the reflected light signal) are transmitted to the front surface of the reflector 110. The incident light signal has an edge portion thereof, which exceeds the reflector 110 and falls on the reflector substrate 130. After being reflected by the reflector substrate 130, the incident light signal deviates from its preset transmission trajectory. For example, a preset transmission trajectory of the transmitted light signal may be to transmit the signal toward the reflector at a designed incident angle, and to reflect the signal by the reflector 110 and then transmit it outwards at a designed angle. Also for example, a preset transmission trajectory of the reflected light signal may be to transmit the signal toward the reflector 110 at an angle which enables it to be coaxial with the transmitted light signal, and to reflect the signal by the reflector 110 and then transmit it to a corresponding turn back mirror 12.

Incident light signals that deviate from the preset transmission trajectory form stray light signals inside the lidar, resulting in a larger detection blind area. Similarly, the front surface of the connection frame 120 is a metal coil 121, the surface of the coil 121 is uneven and has many small grooves distributed thereon. After the incident light signal falls on the connection frame 120, it is reflected a plurality of times in the grooves and also deviates from the preset transmission trajectory of the incident light signal, forming a large number of stray light signals. Therefore, extinction layers arranged on the front surfaces of the connection frame 120 and the reflector substrate 130 can result in absorption of the incident light signal transmitted to the reflector substrate 130 and the connection frame 120. As such, scattering on the surfaces of the connection frame 120 and the reflector substrate 130 can be alleviated; and further reducing the generation of stray light signals.

Optionally, the optical scanning apparatus further includes a diaphragm 160, which is arranged on the front of the reflector 110, the connection frame 120, and the reflector substrate 130. The diaphragm 160 is used to limit the incident light signal and to limit part of the incident light signals with light spots falling outside the reflector 110, such as it is transmitted to the connection frame 120 and the reflector substrate 130. The diaphragm 160 reduces the disordered stray light signals formed after the incident light signals reflect or scatter on the connection frame 120 and the reflector substrate 130, and also reduces the detection blind area caused by the stray light signals, thereby greatly improving receiving and detecting ability of the lidar.

Figure 7:
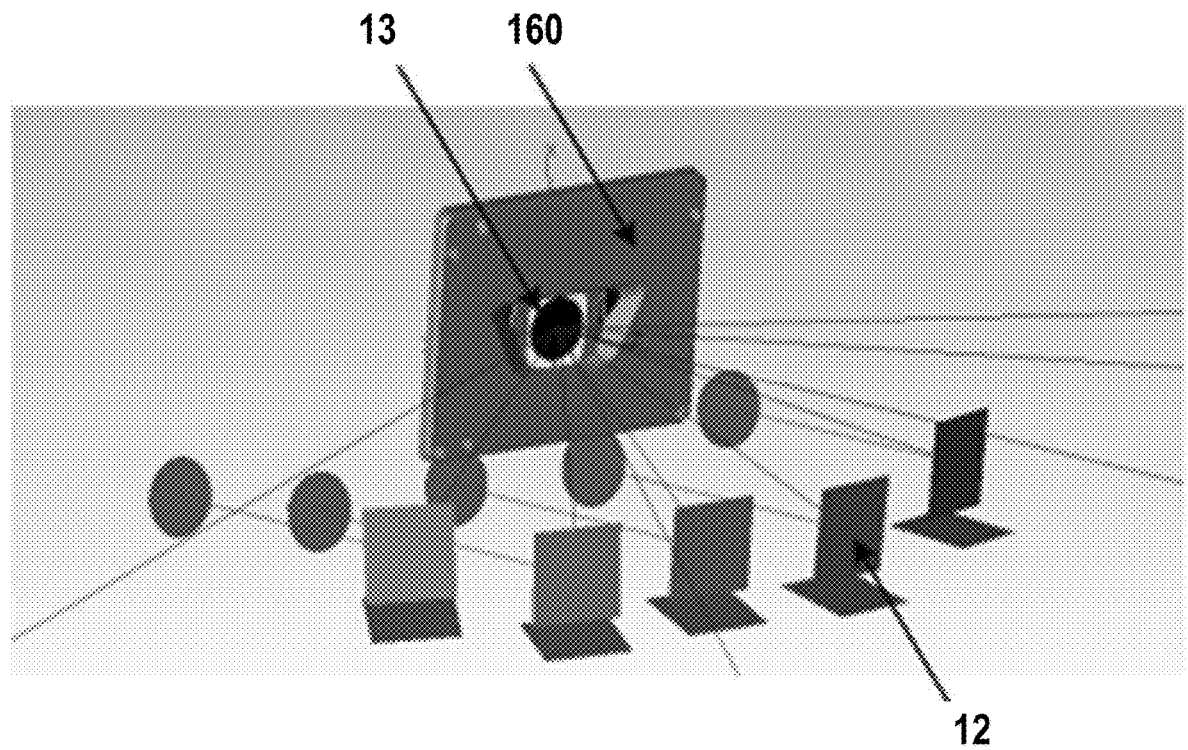
FIG. 7 shows a schematic diagram of a light path in an embodiment of a lidar of the present disclosure.
Figure 8A:
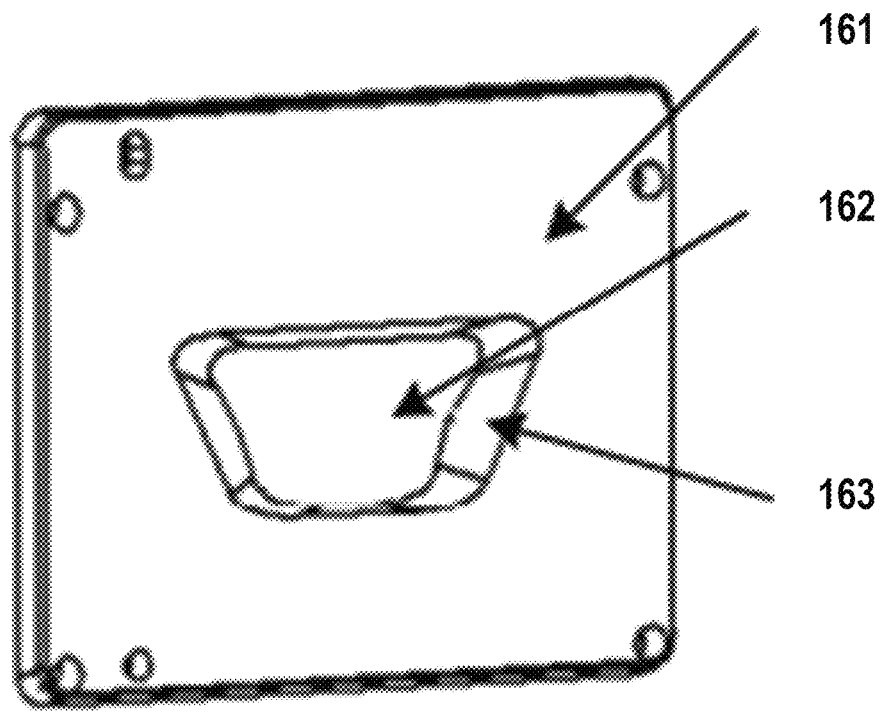
FIGS. 8A and 8B respectively show structural diagrams of a front surface and a back surface of a diaphragm in an embodiment of an optical scanning apparatus of the present disclosure.
Figure 8B:
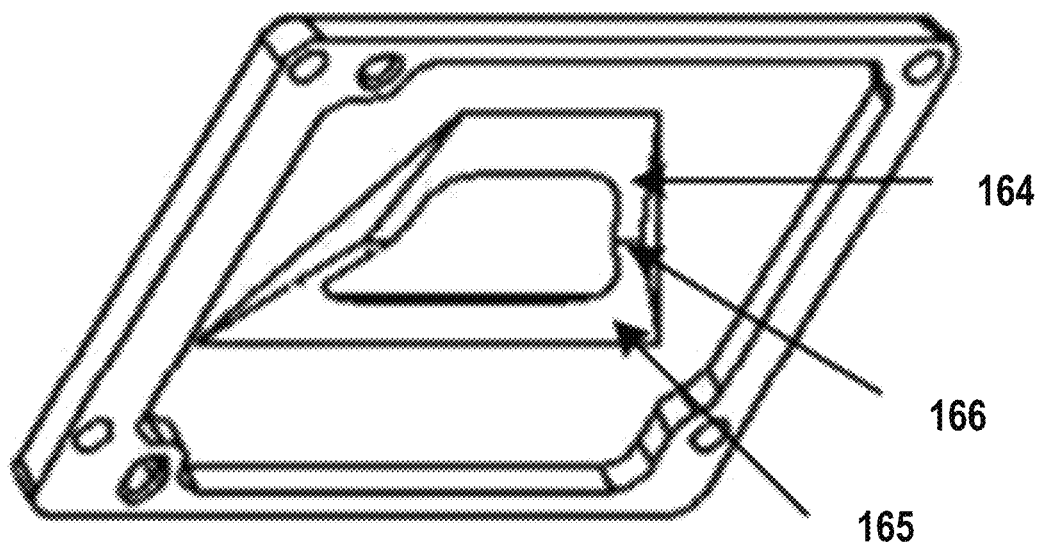

The diaphragm 160 includes a light shielding plate 161 and a light pass aperture 162. The light pass aperture 162 is configured to allow the light signals transmitted to the reflector 110 and the light signals reflected by the reflector to pass through. The light shielding plate 161 is used to block the light signals at the edge of the normal light path and to reduce the stray light signals produced by the light signals transmitted to the connection frame 120 and the reflector substrate 130. Since the incident light signals transmitted to the reflector 110 include the transmitted light signal and the reflected light signal, if the light pass aperture 162 is set very small, it can effectively block the light signal, so that the incident light signals are all transmitted to the reflector 110. It is even possible that the size of the light spot of the incident light signal is smaller than the size of the mirror plane of the reflector 110, and there is no incident light signal transmitted to the connection frame 120 and the reflector substrate 130 at all. Nevertheless, this will also reduce the transmitted light signal and reflected light signal used for detection, so that the lidar cannot effectively detect areas at a long distance, which reduces the ranging ability of the lidar. Therefore, the shape of the light pass aperture 162 is designed to not block the light signal transmitted to the reflector 110 and the light signal reflected by the reflector, which not only ensures that the ranging ability of the lidar is not affected, but also reduces the stray light signal and improves the receiving and detecting ability. As shown in FIGS. 8A and 8B, the shape of the light pass aperture 162 may be trapezoid. When the diaphragm is installed in the lidar shown in FIG. 1, the longer side of the trapezoid of the light pass aperture 162 is arranged above, and the shorter side of the trapezoid is arranged below, the light pass aperture 162 is arranged inverted trapezoidal. Since the light paths of the transmitted light signal and the reflected light signal among the transceiver module 11 and turn back mirror 12 and the optical scanning apparatus 13 are coaxial, i.e., they are spatially overlapping and are only located in opposite directions; the following only uses the transmitted light signal as an example for explanation. As shown in FIG. 7, since the transmitted light signal is reflected by the turn back mirror 12 and then is transmitted inclined upward to the reflector 110 of the optical scanning apparatus 13, the transmitted light signal reflected by the reflector 110 also exits inclined upward to transmit outwards. Due to the compact internal structure of the lidar, the distance between the turn back mirrors 12 is relatively shorter, and the angle between the transmitted light signals transmitted to the reflector 110 after being reflected by two outermost turn back mirror 12 is smaller. In addition, the reflector 110 of the optical scanning apparatus 13 is constantly vibrating, and the angle between the two outermost beams of the transmitted light signals among the transmitted light signals reflected by the reflector 110 becomes significantly larger. From this, it can be seen that the angle between the transmitted light signals transmitted from the bottom up to the reflector 110 is smaller, and the angle between the transmitted light signals that exit in an inclined upward direction from the reflector 110 is larger. Therefore, the light pass aperture 162 of the diaphragm 160 is set to be shorter on the lower side and longer on the upper side. As such, the diaphragm 160 can effectively block the light signals at the edge of the normal light path, and reduce the stray light signals produced by the light signals transmitted to the connection frame 120 and the reflector substrate 130. In addition, the diaphragm 160 can allow the transmitted light signals and the reflected light signals to transmit to the reflector 110 of the optical scanning apparatus 13 as much as possible, in order to ensure the ranging capability of the lidar.

As shown in FIG. 8A, a transitional interface 163 in the shape of a circle is arranged at the light pass aperture 162 of the diaphragm 160, and is arranged on the front surface of the diaphragm 160. In view of the foregoing, the transmitted light signal travels upwards to the reflector 110 from below, and exits from the reflector 110 in an inclined upward direction. The reflected light signal and the transmitted light signal travel in the same light path, but in opposite directions. Therefore, by providing a transitional interface 163 in the shape of a circle on one side of the light pass aperture 162, which side faces the front surface of diaphragm 160, it is possible to alleviate the problem of unnecessary blocking of the light signal caused by the thickness of the light shielding plate 161. Accordingly, unnecessary blocking of the transmitted light signal and the reflected light signal is alleviated, and the ranging ability of the lidar is guaranteed. The shape of the transitional interface 163 may be consistent with the direction of the light signal transmitted to the reflector 110 and transmitted from the reflector 110.

In addition, the diaphragm 160 is provided on the front of the reflector 110 at a preset height. In order to reduce the transmitted light signal and the reflected light signal blocked by the diaphragm 160 as much as possible while meeting the above-mentioned requirements for the size of the light spot of the incident light signal, the diaphragm 160 may be attached directly to the optical scanning apparatus 13, as shown in FIG. 7. For example, the diaphragm 160 is directly attached to the connection frame 120 and the reflector substrate 130, as long as the reflector 110 can be exposed. However, the connection frame 120 and the reflector 110 are driven to vibrate, and the diaphragm 160 cannot be arranged directly on the connection frame 120 and the reflector substrate 130; therefore, the diaphragm 160 is fixed on the front of the reflector 110 at a preset height. The diaphragm 160 is arranged as close as possible to the optical scanning apparatus 13, as long as the diaphragm does not affect the vibration of the connection frame 120 and the reflector 110. A transitional interface 163 in the shape of a circle is provided on one side of the light pass aperture 162, which side facing the front surface of the diaphragm 160. The transitional interface 163 gradually extends backward as it approaches one end of the light pass aperture 162. The light pass aperture 162 is located behind the plane where the front surface of the light shielding plate 161 is located, enabling the light pass aperture 162 of the diaphragm 160 to be closer to the optical scanning apparatus with improved performance.

As the light pass aperture 162 of the diaphragm 160 approaches the optical scanning apparatus 13 in a backward direction, the back surface of the light shielding plate 161 approaching the light pass aperture 162 protrudes rearward, and the space between the light shielding plate 161 and the connection frame 120 and the reflector substrate 130 decreases. As can be seen from the foregoing, the connection frame 120 and the reflector 110 are driven to vibrate, and the back surface of the light shielding plate 161 is too close to the connection frame 120. When the connection frame 120 vibrates, it will be interfered by the light shielding plate 161, causing a hinder to the normal work of the connection frame 120 and the reflector 110. The back surface of the diaphragm 160 is provided with a space for the vibration of the reflector 110 and the connection frame 120. The back surface of the light shielding plate 161 is provided with a plurality of slopes that gradually extend outward from the light pass aperture 162, and the ends of each slope that are away from the light pass aperture 162 gradually extend towards the front surface. The lidar mentioned above may include six groups of transceiver components 11 and correspondingly arranged turn back mirrors 12, i.e., light paths of six transmitted light signals and corresponding light paths of reflected light signals may be arranged along the first axis direction. In order to allow the six paths of transmitted light signals and corresponding reflected light signals arranged along the first axis direction to pass through, the light pass aperture 162 has a diameter in the direction of the first axis larger than diameters in other directions. Therefore, the light shielding plates 161 on both sides of the light pass aperture 162 perpendicular or approximately perpendicular to the first axis direction have less influence on the connection frame 120. By contrast, the light shielding plates 161 on the upper and lower sides of the light pass aperture 162 parallel or approximately parallel to the first axis direction have a greater influence on the connection frame 120. A plurality of slopes provided on the back surface of the light shielding plate 161 can gradually extend in directions perpendicular to the first axis, from their centers to two sides, towards the front surface. As shown in FIG. 8B, the back surface of the light shielding plate 161 is provided with a first slope 164 and a second slope 165, and an intersection line 166 between the first slope 164 and the second slope 165 is parallel to the first axis. The light shielding plate 161 at the intersection line 166 is the rearmost, and extends from the intersection line 166 to both sides perpendicular to the first axis direction respectively, and the ends of the first slope 164 and the second slope 165 farther away from the intersection line 166 are closer to the front. As a result, space between the light shielding plate 161 on the upper and lower sides of the light pass aperture 162 and the connection frame 120 is increased, and the problem of the influence of the light shielding plate 161 on the vibration of the connection frame 120 is solved.

In one embodiment, a lidar is also provided, which includes any one of the optical scanning apparatuses in the foregoing embodiments. The technical principles and technical effects involved in the lidar are the same as in the above-mentioned optical scanning apparatuses, and will not be repeated here.

It should be noted that, unless otherwise stated, the technical terms or scientific terms used in the embodiments of the present disclosure shall be interpreted with the common meanings understood by those skilled in the art to which the embodiments of the present disclosure belong.

In the description of the embodiments of this invention, the azimuth or positional relationships indicated by the technical terms "center", "longitudinal", "transverse", "length", "width", "thickness", "upper", "lower", "front", "back", "left", "right", "vertical", "horizontal", "top", "bottom", "inner" "outer", "clockwise", "counterclockwise", "axial", "radial", "circumferential" etc. are the azimuth or positional relationships based on the drawings, and are used only to facilitate the description of the embodiments of the present disclosure and simplify the description, rather than to indicate or imply the referred apparatus or element must have a specific orientation, be constructed and operated in a specific orientation, and therefore cannot be understood as a limitation to the embodiments of the present disclosure.

In addition, the technical terms "first", "second" etc. are for descriptive purposes only and cannot be understood as indicating or implying relative importance or implicitly indicating the number of indicated technical features. In the description of the embodiments of the present disclosure, the meaning of "plurality" is more than two, unless otherwise specifically limited.

In the description of the embodiments of the present invention, unless otherwise clearly specified and defined, the technical terms "mounted", "connection", "connected", "fixed" and other terms should be understood in a broad sense, for example, it can be a fixed connection, a detachable connection, or integrated; it can also be a mechanical connection or an electrical connection; it can be directly connected, or it can be indirectly connected through intermediaries, or it can be the internal communication of two elements or interaction relationship of two elements. For those of ordinary skill in the art, the specific meaning of the above terms in the embodiments of the present disclosure can be understood according to specific situations.

In the description of the embodiments of the present invention, unless otherwise clearly specified and defined, the first feature is "above" or "below" the second feature, which may be that the first and second features are in direct contact, or the first and second features are indirectly in contact through an intermediary. Moreover, the first feature is "on", "above" and "over" the second feature, which may be that the first feature is directly above or obliquely above the second feature, or simply means that the first feature is higher than the second feature in level. The first feature is "down", "below", and "under" the second feature, which may be that the first feature is directly below or obliquely below the second feature, or simply means that the first feature is less than the second feature in level.

Finally, it should be noted that the above embodiments are only used to illustrate the technical solutions of the present disclosure, not to limit them; although the present disclosure has been described in detail with reference to the foregoing embodiments, those of ordinary skill in the art should understand that the technical solutions described in the foregoing embodiments can still be modified, or some or all of the technical features can be equivalently replaced; and these modifications or replacements do not make the essence of the corresponding technical solutions deviate from the scope of the technical solutions of the embodiments of the present disclosure and should be covered in the scope of the claims and the description of this disclosure. In particular, as long as there is no structural conflict, the technical features mentioned in the various embodiments can be combined in any way. This disclosure is not limited to the specific embodiments disclosed herein, but encompasses all technical solutions falling within the scope of the claims.

The invention claimed is:

1. An optical scanning apparatus, comprising:
a reflector;
a reflector substrate; and
an extinction component,
wherein the reflector is mounted on the reflector substrate,
wherein the extinction component is arranged on a front of the reflector substrate,
wherein the reflector is configured to reflect an incident light signal,
wherein the extinction component is a diaphragm, wherein the diaphragm is arranged on a front of the reflector, and wherein a light pass aperture of the diaphragm is aligned with the reflector.

2. The optical scanning apparatus of claim 1, wherein an area of the light pass aperture of the diaphragm is greater than or equal to an area of the reflector.

3. The optical scanning apparatus of claim 2, wherein the diaphragm is provided on the front of the reflector in accordance with a preset height, and wherein the preset height is determined according to a maximum incident angle of the incident light signal and a radius difference between the diaphragm and the reflector.

4. The optical scanning apparatus of claim 1, wherein a surface scattering coefficient of the diaphragm is smaller than a scattering coefficient of a front surface of the reflector substrate.

5. The optical scanning apparatus of claim 4, wherein the diaphragm is attached with a light absorbing film or a light reflecting film.

6. The optical scanning apparatus of claim 1, wherein a thickness of the diaphragm is less than a preset thickness threshold, the preset thickness threshold being determined by the incident light signal that does not block reflection of the reflector.

7. The optical scanning apparatus of claim 1, wherein the light pass aperture is arranged inverted trapezoidal and wherein the diaphragm is installed with a longer side of a trapezoid of the light pass aperture arranged above, and a shorter side of the trapezoid arranged below.

8. The optical scanning apparatus of claim 1, wherein a transitional interface having a circular shape is arranged at the light pass aperture of the diaphragm, and is arranged on a front surface of the diaphragm, wherein a transmitted light signal travels upwards to the reflector from below and exits from the reflector in an inclined upward direction.

9. An optical scanning apparatus, comprising:
a reflector;
a reflector substrate; and
an extinction component,
wherein the reflector is mounted on the reflector substrate,
wherein the extinction component is arranged on a front of the reflector substrate,
wherein the reflector is configured to reflect an incident light signal, and
wherein a front surface of the reflector substrate is attached with an extinction layer, the extinction layer being configured to reduce scattering of the incident light signal by the reflector substrate.

10. The optical scanning apparatus of claim 9, wherein the extinction layer is a light reflecting layer or a light absorbing layer.

11. A lidar, comprising:
a transceiver;
a turn back mirror; and
an optical scanning apparatus comprising a reflector, a reflector substrate, and an extinction component,
wherein the turn back mirror is configured to reflect light between the transceiver and the optical scanning apparatus,
wherein the reflector is mounted on the reflector substrate,
wherein the extinction component is arranged on a front of the reflector substrate,
wherein the reflector is configured to reflect an incident light signal, and
wherein the extinction component is a diaphragm, wherein the diaphragm is arranged on a front of the reflector, and wherein a light pass aperture of the diaphragm is aligned with the reflector.

12. The lidar of claim 11, wherein an area of the light pass aperture of the diaphragm is greater than or equal to an area of the reflector.

13. The lidar of claim 12, wherein the diaphragm is provided on the front of the reflector in accordance with a preset height, and wherein the preset height is determined according to a maximum incident angle of the incident light signal and a radius difference between the diaphragm and the reflector.

14. The lidar of claim 11, wherein a surface scattering coefficient of the diaphragm is smaller than a scattering coefficient of a front surface of the reflector substrate.

15. The lidar of claim 14, wherein the diaphragm is attached with a light absorbing film or a light reflecting film.

16. The lidar of claim 11, wherein a thickness of the diaphragm is less than a preset thickness threshold, the preset thickness threshold being determined by the incident light signal that does not block reflection of the reflector.

17. The lidar of claim 11, further comprising:
a controller configured to drive and control the transceiver and the optical scanning apparatus.

18. The lidar of claim 11, wherein the light pass aperture is arranged inverted trapezoidal and wherein the diaphragm is installed with a longer side of a trapezoid of the light pass aperture arranged above, and a shorter side of the trapezoid arranged below.

19. The lidar of claim 11, wherein a transitional interface having a circular shape is arranged at the light pass aperture of the diaphragm, and is arranged on a front surface of the diaphragm, wherein a transmitted light signal travels upwards to the reflector from below and exits from the reflector in an inclined upward direction.

20. A lidar, comprising:
a transceiver;
a turn back mirror; and
an optical scanning apparatus comprising a reflector, a reflector substrate, and an extinction component, wherein the turn back mirror is configured to reflect light between the transceiver and the optical scanning apparatus,
wherein the reflector is mounted on the reflector substrate,
wherein the extinction component is arranged on a front of the reflector substrate,
wherein the reflector is configured to reflect an incident light signal, and
wherein a front surface of the reflector substrate is attached with an extinction layer, the extinction layer being configured to reduce scattering of the incident light signal by the reflector substrate.

* * * * *